United States Patent [19]
Okamoto et al.

[11] Patent Number: 5,114,498
[45] Date of Patent: May 19, 1992

[54] PHOTOVOLTAIC DEVICE

[75] Inventors: Shingo Okamoto; Tsuyoshi Takahama; Masato Nishikuni; Shoichi Nakano, all of Osaka, Japan

[73] Assignee: Sanyo Electric Co., Ltd., Moriguchi, Japan

[21] Appl. No.: 502,837

[22] Filed: Mar. 30, 1990

[30] Foreign Application Priority Data

Mar. 31, 1989 [JP] Japan .................................. 1-83104

[51] Int. Cl.⁵ .......................................... H01L 31/075
[52] U.S. Cl. ...................................... 136/258; 357/30
[58] Field of Search ............. 136/258 AM; 357/30 F, 357/30 J, 30K

[56] References Cited

U.S. PATENT DOCUMENTS 4,946,514  8/1990  Nakagawa et al. .................. 136/258

OTHER PUBLICATIONS

*Journal of Non-Crystalline Solids, vols. 97 & 98 (1987) pp. 289-292,North-Holland, Amsterdam, Elsevier Science Publishers B.V., Section 8.*
Device Physics (Focused session 6), article entitled: "High Efficiency a-Si Solar Cells With a Superlattice Structure P-Layer and Stable a-Si Solar Cells With Reduced $SiH_2$ Bond Density", by Y. Kuwano et al.

*Primary Examiner*—Aaron Weisstuch
*Attorney, Agent, or Firm*—W. G. Fasse; D. H. Kane, Jr.

[57] ABSTRACT

A photovoltaic device includes a substrate (1, 10) having a conductive electrode (2, 10), and a first semiconductor layer ($3_1$, $11_1$) of a first conductivity type, a substantially intrinsic second semiconductor layer ($3_2$, $11_2$) and a third semiconductor layer ($3_3$, $11_3$) of the opposite conductivity type successively deposited on the conductive electrode. The hydrogen content in at least the first and second semiconductor layer ($3_1$, $11_1$) is 10% or less. At least the second semiconductor layer ($3_2$, $11_2$), is made of an amorphous semiconductor layer.

9 Claims, 5 Drawing Sheets

PHOTOVOLTAIC DEVICE

FIELD OF THE INVENTION

The present invention relates to photovoltaic devices and particularly to improved output characteristics and to the prevention of a light induced degradation in such a photovoltaic device including a photoactive layer of an amorphous semiconductor.

BACKGROUND INFORMATION

Photovoltaic devices are known which use a substantially intrinsic (i-type) amorphous semiconductor as a photoactive layer which contributes to a photoelectric conversion. The photovoltaic layer is obtained by decomposition of a source gas such as $SiH_4$ or $Si_2H_6$ containing elemental Si. Such amorphous semiconductor unavoidably contains hydrogen from the source gas and the hydrogen serves as a terminator of dangling bonds in the semiconductor network.

An article by Y. Kuwano et al. in *J. Non-Cryst. Solids*, Vols. 97 and 98, 1987, pp. 289-292 teaches that if the quantity of the $Si-H_2$ bond density in the photoactive layer is decreased, it is possible to improve the photoelectric conversion efficiency of the device for a long period. In other words, so-called light induced degradation is reduced. If the concentration of hydrogen in the photoactive layer is decreased, the optical energy band gap Egopt becomes narrow. Accordingly, in a photoactive layer of hydrogenated amorphous silicon (a—Si:H) for example, the absorption coefficient for light in a long wavelength region of about 600 nm or greater, increases and thus it is possible to provide a photovoltaic device having an increased photoelectric current.

It is known that the hydrogen concentration in a deposited amorphous semiconductor film becomes lower if the amorphous semiconductor film is deposited on a substrate having a higher temperature. However, in the case of manufacturing a photovoltaic device, an i-type photoactive layer is normally deposited on a p-type or n-type doped layer already formed on a substrate. Thus the photoactive layer is not directly deposited on the substrate. If the temperature of the substrate is excessively high when a photoactive layer is deposited on a doped layer, dopant or hydrogen in the doped layer would be dissipated or diffused into the photoactive layer which is being grown.

If dopant or hydrogen is diffused into the i-type photoactive layer from the doped layer, the film quality of the i-type layer is impaired and the optical energy band structure changes, particularly near the interface between the doped layer and the i-type layer, whereby the output characteristics of the photovoltaic device are also impaired.

FIG. 1 shows schematically an example of an energy band in a semiconductor film structure having a p-type layer, an i-type layer, and an n-type layer deposited on a substrate in the stated order. In this graph, the ordinate represents the energy band. The dash-dotted horizontal line F represents the Fermi level. The solid line curve A on the upper side represents a lower limit of the conduction band in a case where the p-type layer, the i-type layer and the n type layer are deposited at a relatively low temperature. The solid line curve B on the lower side represents an upper limit of the valence band. If the i-type layer is deposited on the p-type layer at a high temperature, dopant or hydrogen is dissipated from the p-type layer or diffused into the i-type layer and accordingly the energy band structure changes as shown by the broken line curves. More specifically, the energy difference between the p-type layer and the i-type layer becomes small and particularly the inclination of the energy band near the interface between the p-type layer and the i-type layer becomes flat. Consequently, the internal electric field for drifting carriers generated in the i-type layer by light irradiation becomes weak and particularly the carriers are likely to be trapped in a region near the interface between the i-type layer and the p-type layer. As a result, the output characteristics of the photovoltaic device deteriorate.

In addition, a doped layer on the side of incidence of light has preferably a so-called window effect whereby the amount of incident light absorbed in the doped layer is reduced. Therefore, the doped layer on the side of light incidence is intentionally formed to contain 15% hydrogen or more, for example, so that it has a large optical energy band gap. Therefore, if a photoactive layer is to be deposited on a doped layer on the side of light incidence, it is desired to deposit the photoactive layer at a relatively low temperature in order to avoid dissipation or diffusion of hydrogen.

As described above, for reducing the light induced degradation of the photovoltaic device, it is desirable to deposit the photoactive layer at a relatively high temperature. However, for the purpose of preventing a deterioration of the output characteristics, it is desirable to deposit the photoactive layer at a relatively low temperature of 200° C. or less. Hence, these two requirement pose a problem.

SUMMARY OF THE INVENTION

It is object of the present invention to prevent a light induced degradation and to improve the output characteristics in a photovoltaic device including a photoactive layer of an amorphous semiconductor material.

A photovoltaic device according to the present invention includes: a substrate having a conductive electrode, and a first semiconductor layer of a first conductivity type, a substantially intrinsic second semiconductor layer, and a third semiconductor layer of the opposite conductivity type, deposited successively on the conductive electrode. The hydrogen content in the first and second semiconductor layers is 10% or less and at least the second semiconductor layer is formed of an amorphous semiconductor material.

The foregoing and other objects, features, aspects and advantages of the present invention will become more apparent from the following detailed description of the present invention when taken in conjunction with the accompanying drawings.

DESCRIPTION OF PREFERRED EMBODIMENTS OF THE INVENTION

Figure 1:
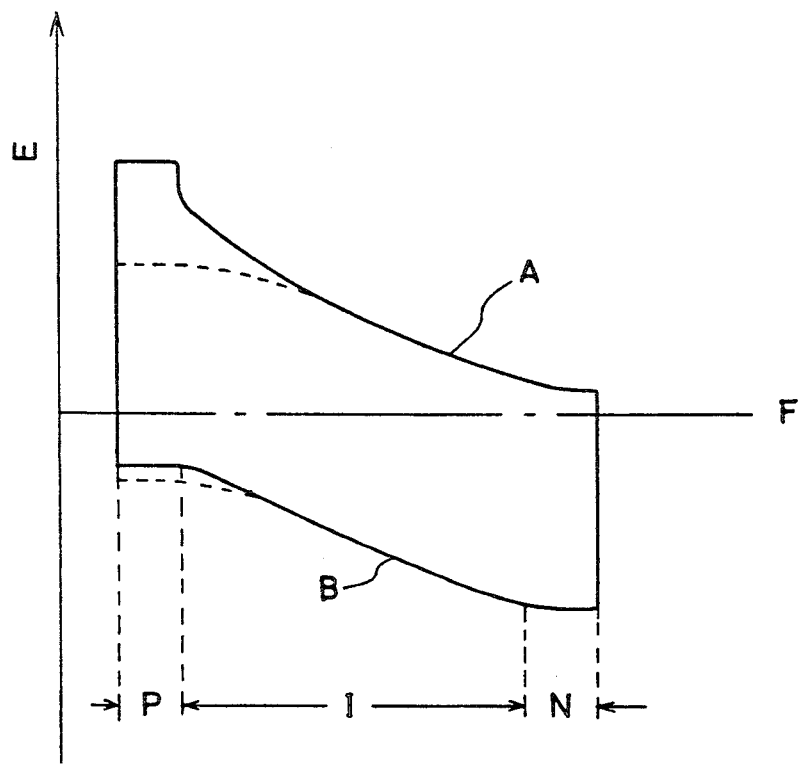
FIG. 1 is a graph showing an energy band in a semiconductor film including a p-type layer, an i-type layer and an n-type layer.
Figure 2:
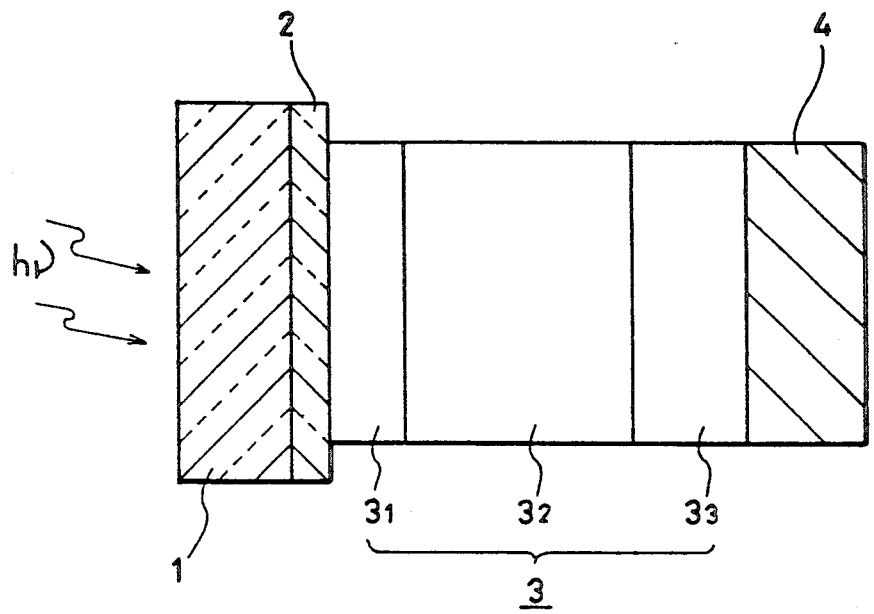
FIG. 2 is a schematic sectional view showing a structure of a photovoltaic device according to an embodiment of the present invention.

FIG. 2 shows a schematic sectional view through a photovoltaic device according to an embodiment of the present invention. A substrate 1 of a transparent insulator such as glass, has a first surface on which light energy $h\nu$ is incident, and a second surface opposite to the first surface. A front electrode 2 of TCO (transparent conductive oxide) such as ITO (indium tin oxide) or $SnO_2$ is formed on the second surface of the substrate 1. A semiconductor film 3 is deposited on the front electrode 2 by a decomposition of source gases. The semiconductor film 3 is formed to contain a semiconductor junction such as pin or pn$^-$n$^+$ parallel to the film. A back electrode 4 is formed on the semiconductor film 3. The back electrode 4 may have a single-layer structure or a multi-layer structure of metal such as Al, Ti, Ag, Ni and Cr. The multi-layer structure of the back electrode 4 has a TCO layer formed on the semiconductor film 3 and a high-reflective metal layer formed thereon.

The semiconductor film 3 includes three layers. A first semiconductor layer $3_1$ of a first conductivity type, e.g., the p-type is formed on the front electrode 2 and made of an amorphous semiconductor or microcrystalline semiconductor material containing hydrogen. A second semiconductor layer $3_2$ which is substantially intrinsic, is deposited on the first semiconductor layer $3_1$. The second layer $3_2$ is made of an amorphous semiconductor material also containing hydrogen. A third semiconductor layer $3_3$ of the opposite conductivity type, e.g., the n-type is formed on the second semiconductor layer and made of an amorphous semiconductor or microcrystalline semiconductor material also containing hydrogen. The semiconductor layers $3_1$, $3_2$, $3_3$ can be deposited by decomposition of source gas containing Si as a main component such as $SiH_4$ or $Si_2H_6$. During the deposition hydrogen is introduced into the semiconductor layers to serve as a terminator of dangling bonds of silicon.

The amorphous semiconductor material to be used may be, for example, hydrogenated amorphous silicon (a—Si:H), hydrogenated amorphous silicon germanium (a—$Si_xGe_{1-x}$:H), hydrogenated amorphous silicon carbide (a—$Si_xC_{1-x}$:H), hydrogenated amorphous silicon oxide (a—$Si_xO_{1-x}$:H), hydrogenated amorphous silicon nitride (a—$Si_xN_{1-x}$:H) or hydrogenated amorphous silicon oxynitride (a—$Si_{1-x-y}O_xN_y$:H). The same composition as that of the amorphous semiconductor can be used for the microcrystalline semiconductor.

Preferably, the first semiconductor layer $3_1$ is formed by a—$Si_xC_{1-x}$:H, which makes it possible to obtain a wide optical band gap. The second and third semiconductor layers $3_2$, $3_3$ can be formed by a—Si:H which makes it possible to easily obtain excellent film characteristics. Table I shows an example of various conditions in the case of depositing the first to third semiconductor layers $3_1$ to $3_3$ by a plasma CVD method using an RF (high radio frequency) power supply of 13.56 MHz.

TABLE I

| semi-conductor layer | gas flow rate (SCCM) | pressure (Torr) | substrate temperature (°C.) | RF power (W) | film thickness (Å) |
|---|---|---|---|---|---|
| first | $SiH_4$ = 2<br>$CH_4$ = 4<br>$B(CH_3)_3$ = 0.02<br>He = 200 | 0.2 | 400 | 10 | 200 |
| second | $SiH_4$ = 2 | 0.1 | 350 | 10 | 4000 |
| third | $SiH_4$ = 10<br>$PH_3$ = 0.1 | 0.1 | 200 | 15 | 400 |

An important feature which can be seen from Table I is that the substrate temperature during the deposition of the first semiconductor layer $3_1$ is maintained at 400° C., which is substantially higher than 200° C. conventional substrate temperature. The substrate temperature during the deposition of the second semiconductor layer $3_2$ is maintained at 350° C., which is considerably higher than 200° C.

Table II shows various film characteristics of the first to third semiconductor layers $3_1$ to $3_3$ deposited successively under the conditions shown in Table I. Since the first semiconductor layer $3_1$ is deposited at the high temperature of 400° C., the hydrogen content in the first semiconductor layer is as low as 6%. However, carbon in the first semiconductor layer compensates for a decrease of the optical band gap caused by the decrease of the hydrogen content so that a large band gap of Egopt=2.1 eV can be maintained. Since the second semiconductor layer $3_2$ serving as the photoactive layer for generating optical carriers which contribute to the photoelectric conversion, is also deposited at the high temperature of 350° C. on the first semiconductor layer $3_1$, the hydrogen content in the second semiconductor layer $3_2$ is also lowered to 9%. On the other hand, the third semiconductor layer $3_3$ is deposited on the second semiconductor layer $3_2$ at 200° C. which is the conventional substrate temperature and consequently the third semiconductor layer $3_3$ has a hydrogen content of 15% which is a normal value.

TABLE II

| semiconductor layer | Egopt (eV) | hydrogen content (%) | dark conductivity $(\Omega cm)^{-1}$ | photo-conductivity $(\Omega cm)^{-1}$ |
|---|---|---|---|---|
| first | 2.1 | 6 | $5.0 \times 10^{-5}$ | $5.0 \times 10^{-5}$ |
| second | 1.68 | 9 | $7.0 \times 10^{-10}$ | $1.0 \times 10^{-4}$ |
| third | 1.8 | 15 | $2.0 \times 10^{-2}$ | $2.0 \times 10^{-2}$ |

Table II shows that the hydrogen content increases from the first layer to the third layer and that the hydrogen content in the first and second layers is less than 10% in the present device having the film characteristics shown in Table II.

Table III shows initial photovoltaic characteristics. These characteristics include open-circuit voltage Voc, short-circuit current Isc, fill factor FF and photoelectric conversion efficiency $\eta$ measured under an irradiation having an intensity of 100 mW/cm$^2$ of AM-1 light, corresponding to the sun light spectrum at the equator. Table III also shows the initial photovoltaic characteristics of a device measured for comparison. The device used for comparing, the first semiconductor layer was deposited at the conventional substrate temperature of 200° C., whereby the first semiconductor layer has a normal hydrogen content of 15%. However, the flow rate of CH₄ gas during the deposition of the first semiconductor layer was decreased to 1SCCM and accordingly the first semiconductor layer of the comparing device has the same optical energy band gap Egopt=2.1 eV as that of the first semiconductor layer of the present device. Thus, the comparing device has nearly the same film characteristics as those shown in Table II except that the hydrogen content in the first semiconductor layer is increased to 15%.

TABLE III

|  | Voc (V) | Isc (mA/cm²) | FF | η (%) |
| --- | --- | --- | --- | --- |
| embodiment | 0.87 | 18.8 | 0.72 | 11.8 |
| device for comparison | 0.75 | 14.3 | 0.55 | 5.9 |

As a result of the comparison shown in Table III, it was found that the photovoltaic characteristics of the present device are considerably improved by not only lowering the hydrogen content in the second semiconductor layer to 10% or less but also by lowering the hydrogen content in the first semiconductor layer on which the second semiconductor layer is deposited, to 10% or less. Therefore, in order to examine the causes of the improvement of the photovoltaic characteristics, measurements were made by using SIMS (secondary ion mass spectroscopy), of the boron concentration of the p-type layer and of hydrogen concentration profiles in the depth direction of the semiconductor film in the present device and in the comparing device. The measured results are shown in Table III.

Figure 3A:
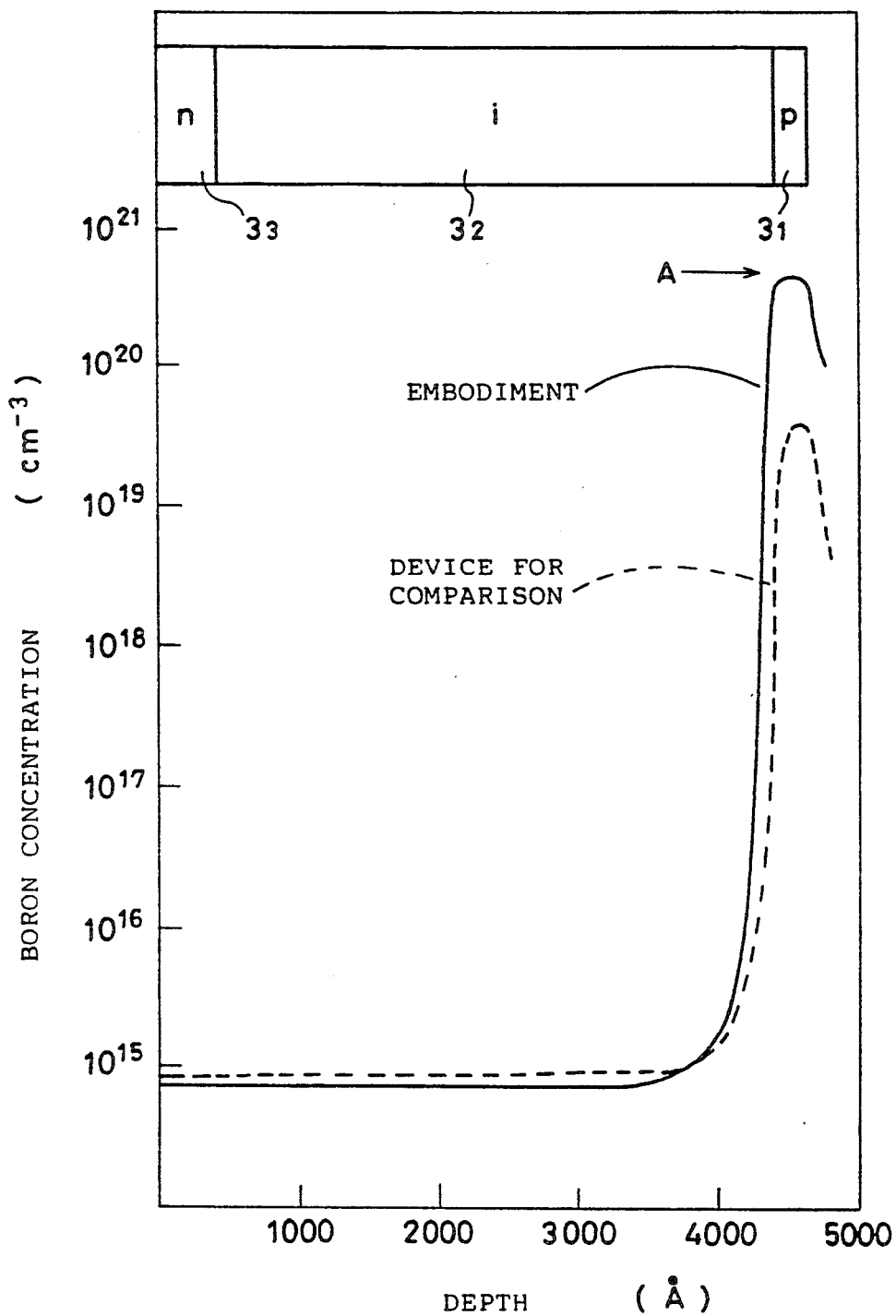
FIG. 3A is a graph showing a profile of a boron concentration in a semiconductor film.

FIG. 3A shows a boron concentration profile in the semiconductor film. The abscissa represents depth (Å) of the semiconductor film from the surface of the third semiconductor layer and the ordinate represents the boron concentration (cm⁻³). In an upper portion of this figure, the first to third semiconductor layers are schematically shown corresponding to the respective depths on the abscissa. In the graph of FIG. 3A, the solid line curve represents the boron concentration profile of the present device. The broken line curve shows the boron concentration profile of the comparing device. The level A shown by the horizontal arrow A represents the boron concentration in the first semiconductor layer after it is formed on the substrate and before the second semiconductor layer is deposited thereon, in the present device and in the comparing device.

As can be seen from the graph of FIG. 3A, diffusion or dissipation of boron hardly occurs in the second semiconductor layer of both devices. Boron is unlikely to diffuse in the second semiconductor layer since the hydrogen concentration in the second semiconductor layer is as low as 9%. However, the boron concentration in the first semiconductor layer of the comparing device is ten times smaller than that in the first semiconductor layer of the present device. Since the first semiconductor layer of the comparing device had the boron concentration of level A before the deposition of the second semiconductor layer, it follows that a large quantity of boron was dissipated from the first semiconductor layer before and/or during the deposition of the thick second semiconductor layer at the high temperature of 350° C. By contrast, in the present device, since only 6% of hydrogen is contained in the first semiconductor layer, it is believed that the dissipation of boron from the first semiconductor layer is considerably suppressed because it is difficult to diffuse boron.

Figure 3B:
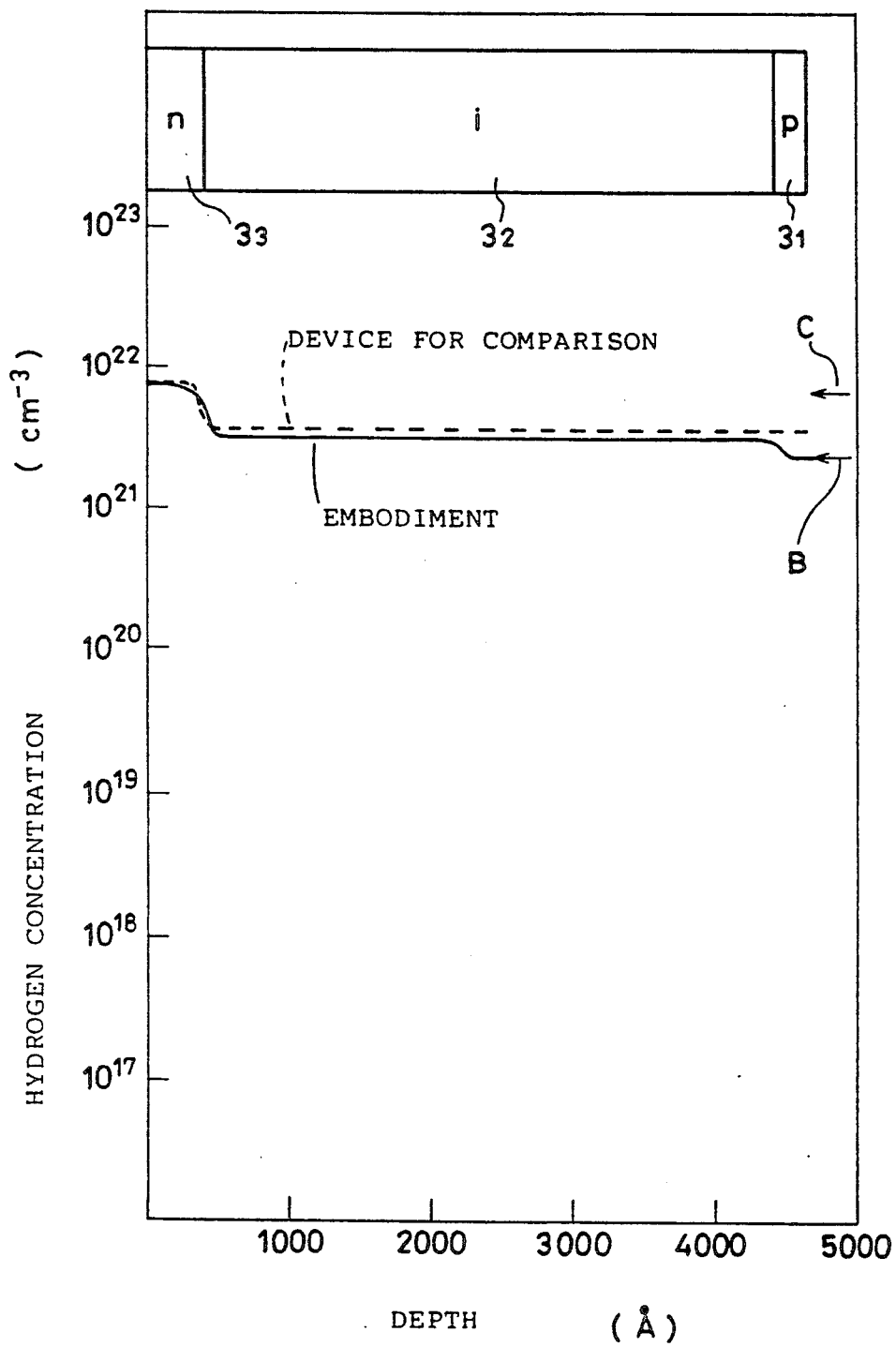
FIG. 3B is a graph showing a profile of a hydrogen concentration in a semiconductor film.

FIG. 3B, which is similar to FIG. 3A, represents hydrogen concentrations in the semiconductor films. The levels B and C shown by the horizontal arrows B and C represent the hydrogen concentrations in the respective first semiconductor layers after these layers are formed on the respective substrates and before the second semiconductor layers are deposited in the present device and the comparing device. As can be seen from the graph of FIG. 3B, the hydrogen concentration in the semiconductor layer of the present device hardly changes after the deposition of the second semiconductor layer. On the other hand, the hydrogen concentration in the first semiconductor layer of the comparing device is considerably decreased after the deposition of the second semiconductor layer.

In conclusion, it is believed that since the first semiconductor layer of the comparing device contains the large quantity of hydrogen of 15% and has a loose structure, boron and hydrogen are dissipated from the first semiconductor layer during the deposition of the second semiconductor layer at the high temperature of 350° C., thereby causing a deterioration of the photovoltaic characteristics of the comparing device as shown in Table III, compared to the present device.

Table IV shows the photovoltaic characteristics obtained after an irradiation test for five hours with an intensity of 500 mW/cm² of AM-1 light in the present device having the initial photovoltaic characteristics shown in Table III. The values in the lower row of Table IV indicate the photovoltaic characteristics after the irradiation test, normalized by the initial photovoltaic characteristics. It is to be understood from the normalized values that the present device has excellent resistance to light induced degradation.

TABLE IV

|  | Voc | Isc | FF | (%) |
| --- | --- | --- | --- | --- |
| after 5 hours | 0.865 (V) | 18.7 (mA/cm²) | 0.70 | 11.3 (%) |
| normalized value | 0.99 | 0.99 | 0.97 | 0.96 |

Figure 4:
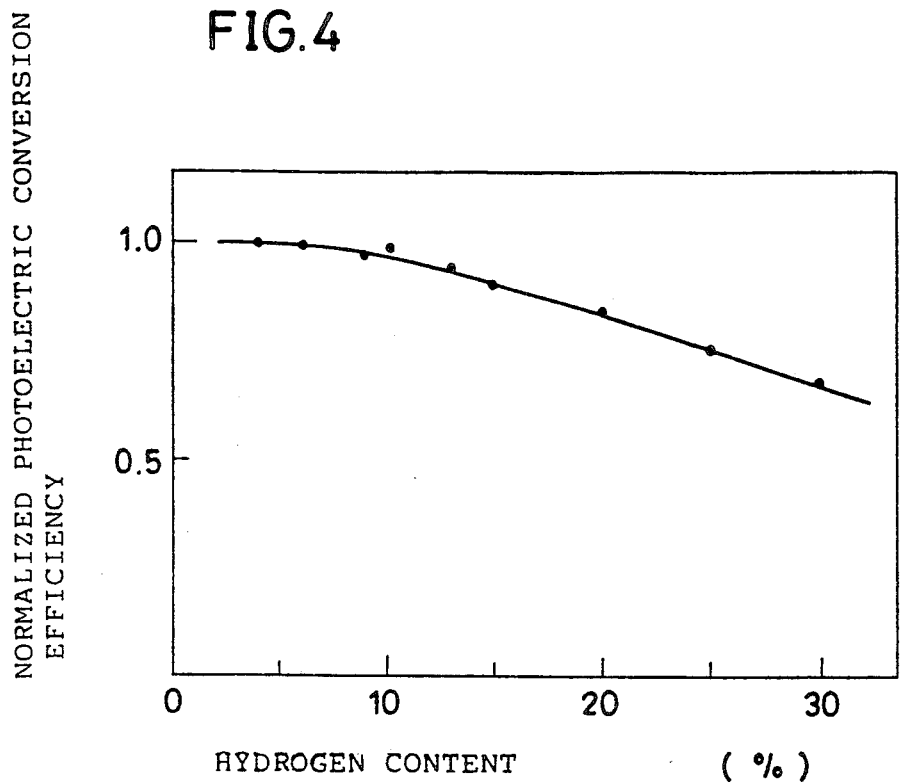
FIG. 4 is a graph showing the relationship between the hydrogen content in the second semiconductor layer and a light induced deterioration of a photovoltaic device.

FIG. 4 shows the relationship between the hydrogen content in the second semiconductor layer and the light induced degradation of the photovoltaic device. In the graph of FIG. 4 the abscissa represents the hydrogen concentration in the second semiconductor layer and the ordinate represents a photoelectric conversion efficiency after the light irradiation test, normalized by the initial values. In the photovoltaic device using the irradiation test, the hydrogen content has been changed only in the second semiconductor layer while the other film characteristics are substantially the same as shown in Table II. As is clearly seen from the graph of FIG. 4, there is little change in the light induced degradation with the hydrogen content in the second semiconductor layer being up to 10%. However, if the hydrogen content exceeds 10%, the light induced deterioration increases.

Figure 5:
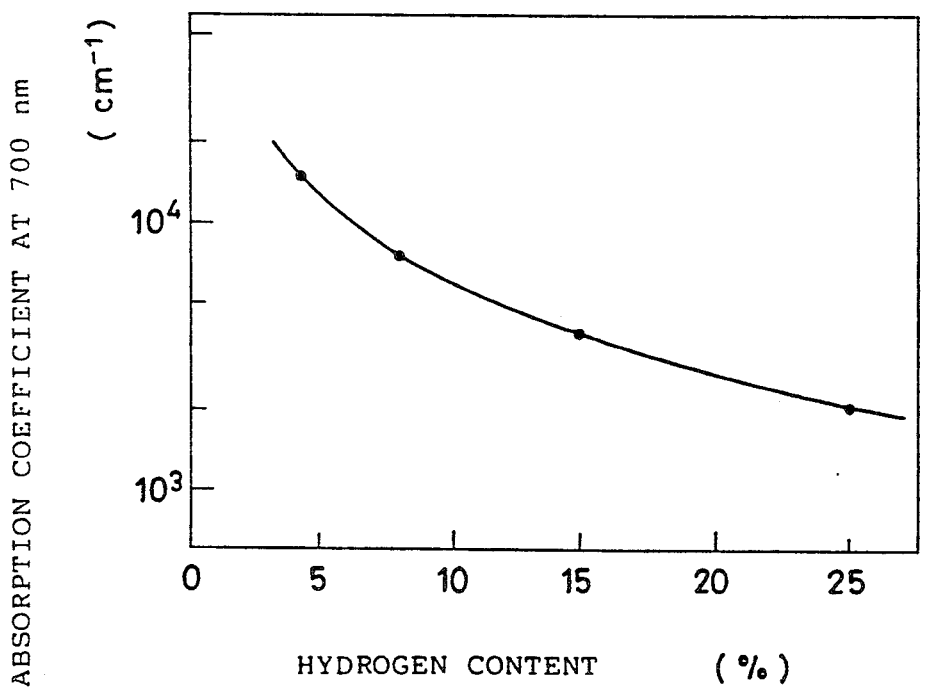
FIG. 5 is a graph showing the relationship between the hydrogen content in the second semiconductor layer and a long wavelength light absorption coefficient.

FIG. 5 is similar to FIG. 4 and the ordinate in the graph of FIG. 5 represents the absorption coefficient of the second semiconductor layer with respect to light having a long wavelength of 700 nm. As the hydrogen content in the second semiconductor layer increases, the absorption coefficient decreases, which means that light of a long wavelength is absorbed efficiently according to a decrease of the hydrogen content in the second semiconductor layer and that the absorbed long wavelength light contributes to an improvement in the photoelectric conversion efficiency.

In view of the foregoing, it is understood that a first semiconductor layer having a hydrogen content of 10% or less, and preferably 6% or less provides excellent initial photovoltaic characteristics for the photovoltaic device. In addition, a second semiconductor layer having a hydrogen content of 10% or less and preferably 6% or less suppresses a light induced degradation of the photovoltaic device and improves the photoelectric conversion efficiency by using long wavelength light.

Further, in the first semiconductor layer, the decrease of the optical band gap due to the lowering of the hydrogen content, can be compensated by adding an element such as carbon, nitrogen and oxygen for increasing the optical band gap. Consequently, it is possible to make the first semiconductor layer so that it has a sufficient window effect in spite of the lowering of the hydrogen content thereby to provide better photovoltaic characteristics.

In the above described embodiment, the n-type third semiconductor layer is deposited at the conventional substrate temperature of 200° C. whereby the third layer has a hydrogen content of 15%. However, the third layer may also deposited at a high substrate temperature of about 300° C. or more to have a hydrogen content of about 10% or less. In addition, the semiconductor junction in the semiconductor film is not limited to the pin type. It may be a $pn^-n^+$ or nip type and it may have a tandem structure including two or more of such semiconductor junctions.

Figure 6:
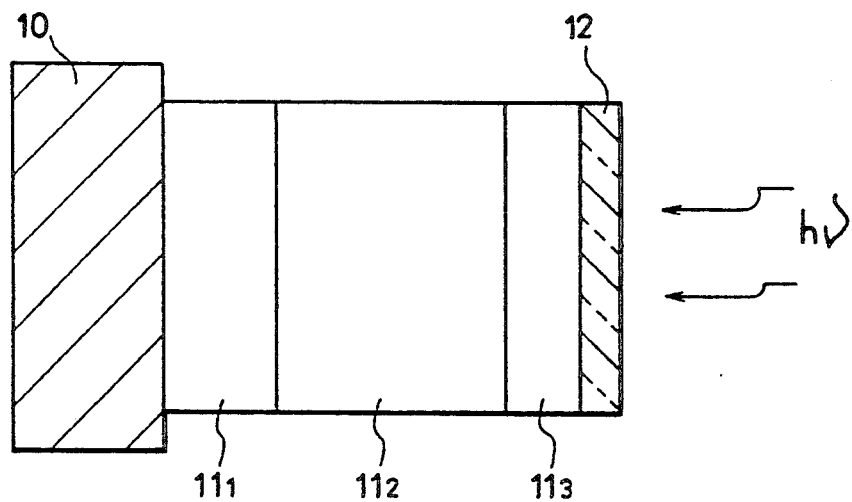
FIG. 6 is a schematic sectional view of a structure of a photovoltaic device according to another embodiment of the present invention.

Referring to FIG. 6, a structure of a photovoltaic device according to another embodiment of the present invention is shown as a schematic sectional view. In the embodiment of FIG. 6, the direction of incident light is reversed compared with the embodiment of FIG. 2. More specifically, the substrate 10 does not need to be transparent, whereby metal, ceramics, heat-resisting plastics or the like can be used for making the substrate 10. If the substrate 10 is made of metal, it can be also used as an electrode. A first semiconductor layer $11_1$ of one conductivity type, a substantially intrinsic second semiconductor layer $11_2$ and a third semiconductor layer $11_3$ of the opposite conductivity type are deposited successively on the metal substrate 10. The hydrogen contents of at least the first and second semiconductor layers $11_1$, $11_2$ are 10% or less. In this case, the first semiconductor layer $11_1$ does not need to serve as a window layer and it is not necessary to add an element for increasing the band gap. A front electrode of TCO is formed on the third semiconductor layer $11_3$.

In each of the above described embodiments, at least the first and second semiconductor layers have a hydrogen content of 10% or less. However, only the first semiconductor layer may have a hydrogen content of about 10% or less. The low hydrogen content of the first semiconductor layer serves not only to prevent a dissipation of dopant but also to suppress a diffusion and entrance of impurity elements from an adjacent electrode.

In addition, in the case where the first semiconductor layer has such a low hydrogen content, even if the temperature in the photovoltaic device increases when it is operating, the first semiconductor layer serves as a blocking layer against heat dissipation of an impurity from an adjacent electrode or substrate to the first and the second semiconductor layer whereby the thermal stability of the photovoltaic device can be improved. Similarly, if the hydrogen content of the third semiconductor layer is decreased to about 10% or less, it is possible to suppress a diffusion of an impurity from an adjacent electrode into the semiconductor film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising a substrate having a conductive electrode, and a first semiconductor layer of a first conductivity type consisting of a single layer, a substantially intrinsic second semiconductor layer and a third semiconductor layer of a conductivity type opposite to the first conductivity type, deposited successively on said conductive surface, said first and second semiconductor layers each having a hydrogen content of 10% or less, and wherein at least said second semiconductor layer is formed of an amorphous semiconductor material.

2. The photovoltaic device of claim 1, wherein the hydrogen content in said third semiconductor layer is also 10% or less.

3. The photovoltaic device of claim 1, wherein said substrate is transparent, said second semiconductor layer is irradiated by light through said first semiconductor layer and said first semiconductor layer contains both hydrogen and at least one more element other than hydrogen, selected from a group consisting of elements for increasing the optical energy band gap thereof.

4. The photovoltaic device of claim 3, wherein said group consists of carbon, nitrogen, and oxygen.

5. A photovoltaic device comprising a substrate (1) having a conductive surface (2), a first semiconductor layer of a first conductivity type, a substantially intrinsic second semiconductor layer, and a third semiconductor layer of a conductivity type opposite to the first conductivity type, deposited successively on said conductive surface, at least said second semiconductor layer being made of an amorphous semiconductor, and wherein said first and second semiconductor layers each have a hydrogen content of less than 10% and the hydrogen content of said first semiconductor layer is less than the hydrogen content of said second semiconductor layer.

6. The photovoltaic device of claim 5, wherein the hydrogen content in said third semiconductor layer ($3_3$, $11_3$) is also 10% or less.

7. The photovoltaic device of claim 5, wherein said substrate (1) is transparent, said second semiconductor layer ($3_2$) is irradiated by light through said first semiconductor layer ($3_1$) and said first semiconductor layer ($3_1$) contains both hydrogen and at least one more element other than hydrogen, selected from a group consisting of elements for increasing the optical energy band gap thereof.

8. The photovoltaic device of claim 5, wherein said group consists of carbon, nitrogen, and oxygen.

9. The photovoltaic device of claim 6, wherein said hydrogen content of said first, second, and third layers increases from said first layer to said third layer such that the hydrogen content in said first and second layers remains below 10%.

* * * * *